United States Patent
Bierman et al.

(10) Patent No.: US 10,254,330 B2
(45) Date of Patent: Apr. 9, 2019

(54) PARTIAL DISCHARGE DETECTION BANDWIDTH EXPANSION THROUGH INPUT SIGNAL ALIASING

(71) Applicant: AVO MULTI-AMP CORPORATION, Dallas, TX (US)

(72) Inventors: Adam Bierman, Fort Collins, CO (US); Craig Powers, Fort Collins, CO (US)

(73) Assignee: AVO MULTI-AMP CORPORATION, Dallas, TX (US)

( * ) Notice: Subject to any disclaimer, the term of this patent is extended or adjusted under 35 U.S.C. 154(b) by 489 days.

(21) Appl. No.: 14/836,180

(22) Filed: Aug. 26, 2015

(65) Prior Publication Data

US 2017/0059642 A1    Mar. 2, 2017

(51) Int. Cl.
*G01R 31/12*    (2006.01)

(52) U.S. Cl.
CPC .................... *G01R 31/1263* (2013.01)

(58) Field of Classification Search
USPC .......... 324/551, 537, 500, 765.01, 128, 337, 324/533, 541, 557, 637, 76.11; 341/110, 341/155, 120, 132, 164; 702/85; 347/19; 367/13, 135
See application file for complete search history.

(56) References Cited

U.S. PATENT DOCUMENTS

| | | | | |
|---|---|---|---|---|
| 5,471,144 A * | 11/1995 | Meyer | ................ | G01R 31/1272 324/118 |
| 2006/0038573 A1* | 2/2006 | Sarkozi | .............. | G01R 31/1272 324/536 |
| 2007/0057678 A1* | 3/2007 | Dvorak | ................ | G01R 31/024 324/536 |
| 2009/0067200 A1* | 3/2009 | Bolz | ..................... | H02J 7/0014 363/17 |
| 2010/0152600 A1* | 6/2010 | Droitcour | ................ | A61B 5/05 600/534 |
| 2012/0098672 A1* | 4/2012 | Restrepo | .............. | H02H 1/0015 340/815.45 |
| 2013/0049735 A1* | 2/2013 | Shafer | ..................... | H03F 1/523 324/76.11 |
| 2014/0125353 A1* | 5/2014 | Shu | ........................ | G01R 15/16 324/551 |
| 2014/0128863 A1* | 5/2014 | Du | ................... | A61B 17/22012 606/34 |

* cited by examiner

*Primary Examiner* — Melissa J Koval
*Assistant Examiner* — Nasima Monsur
(74) *Attorney, Agent, or Firm* — EIP US LLP

(57) ABSTRACT

A partial discharge detection board includes a voltage divider configured to attenuate a voltage of a reflected signal. A buffer is connected to the voltage divider. The buffer attenuates frequencies of the reflected signal that are greater than an upper cutoff frequency. An analog-to-digital converter is connected to the buffer. The analog-to-digital converter receives portions of the reflected signal up to the upper cutoff frequency, and the analog-to-digital converter converts the reflected signal from an analog domain to a digital domain. A filter is connected to the analog-to-digital converter. The filter attenuates frequencies of the reflected signal that are less than a lower cutoff frequency. A comparator is connected to the filter. The comparator compares the voltage of the reflected signal to a reference voltage. A counter is connected to the comparator. The counter increments when the voltage of the reflected signal is greater than the reference voltage.

20 Claims, 2 Drawing Sheets

PARTIAL DISCHARGE DETECTION BANDWIDTH EXPANSION THROUGH INPUT SIGNAL ALIASING

BACKGROUND

Partial discharge refers to a localized dielectric breakdown in a portion of the electrical insulation system of a device (e.g., a motor) when the insulation system is under high-voltage stress. The breakdown is caused by one or more cracks, voids, or inclusions in the insulation system. Partial discharges cause small, but significant, damage to the device, and indicate that the insulation system is beginning to fail, which may lead to catastrophic damage in the future. As such, it is desirable to detect partial discharges so that the insulation system is repaired or replaced before such damage occurs.

To detect partial discharges, a partial discharge detection board is coupled to the device and adapted to analyze signals from (e.g., reflected off of) the device to determine whether the device is experiencing partial discharges when the device is exposed to a particular voltage. The partial discharge detection board includes an analog-to-digital converter ("ADC") that samples the signals at a sampling rate of, for example, 100 MHz. The ADC is unable to distinguish portions of the signal above the Nyquist frequency (e.g., 50 MHz in this example). Thus, conventional partial discharge detection boards include an anti-aliasing filter to remove portions of the signal above the Nyquist frequency.

SUMMARY

A partial discharge detection board is disclosed. The board includes a voltage divider configured to attenuate a voltage of a reflected signal. A buffer is connected to the voltage divider. The buffer attenuates frequencies of the reflected signal that are greater than an upper cutoff frequency. An analog-to-digital converter is connected to the buffer. The analog-to-digital converter receives portions of the reflected signal up to the upper cutoff frequency, and the analog-to-digital converter converts the reflected signal from an analog domain to a digital domain. A filter is connected to the analog-to-digital converter. The filter attenuates frequencies of the reflected signal that are less than a lower cutoff frequency. A comparator is connected to the filter. The comparator compares the voltage of the reflected signal to a reference voltage. A counter is connected to the comparator. The counter increments when the voltage of the reflected signal is greater than the reference voltage.

In another embodiment, the board includes a voltage divider configured to attenuate a voltage of a reflected signal. The voltage divider does not include a capacitor or an inductor. A buffer is connected to the voltage divider. The buffer attenuates frequencies of the reflected signal that are greater than an upper cutoff frequency. An analog-to-digital converter is connected to the buffer. An anti-aliasing filter is not positioned between the voltage divider and the analog-to-digital converter. The analog-to-digital converter receives portions of the reflected signal between a Nyquist frequency of the analog-to-digital converter and the upper cutoff frequency, and the analog-to-digital converter converts the reflected signal from an analog domain to a digital domain. A filter is connected to the analog-to-digital converter. The filter attenuates frequencies of the reflected signal that are less than a lower cutoff frequency. A comparator is connected to the filter. The comparator compares the voltage of the reflected signal to a reference voltage. A counter is connected to the comparator. The counter increments when the voltage of the reflected signal is greater than the reference voltage.

A method for detecting a partial discharge is also disclosed. The method includes transmitting an electrical pulse to a device. The electrical pulse reflects off of the device producing a reflected signal. A voltage of the reflected signal is attenuated using a voltage divider. One or more frequencies of the reflected signal that are greater than an upper cutoff frequency are attenuated using a buffer. The reflected signal is converted from an analog domain to a digital domain using an analog-to-digital converter. The analog-to-digital converter receives portions of the reflected signal between a Nyquist frequency of the analog-to-digital converter and the upper cutoff frequency.

BRIEF DESCRIPTION OF THE DRAWINGS

The accompanying drawings, which are incorporated in and constitute a part of this specification, illustrate an embodiment of the present teachings and together with the description, serve to explain the principles of the present teachings. In the figures.

Figure 1:
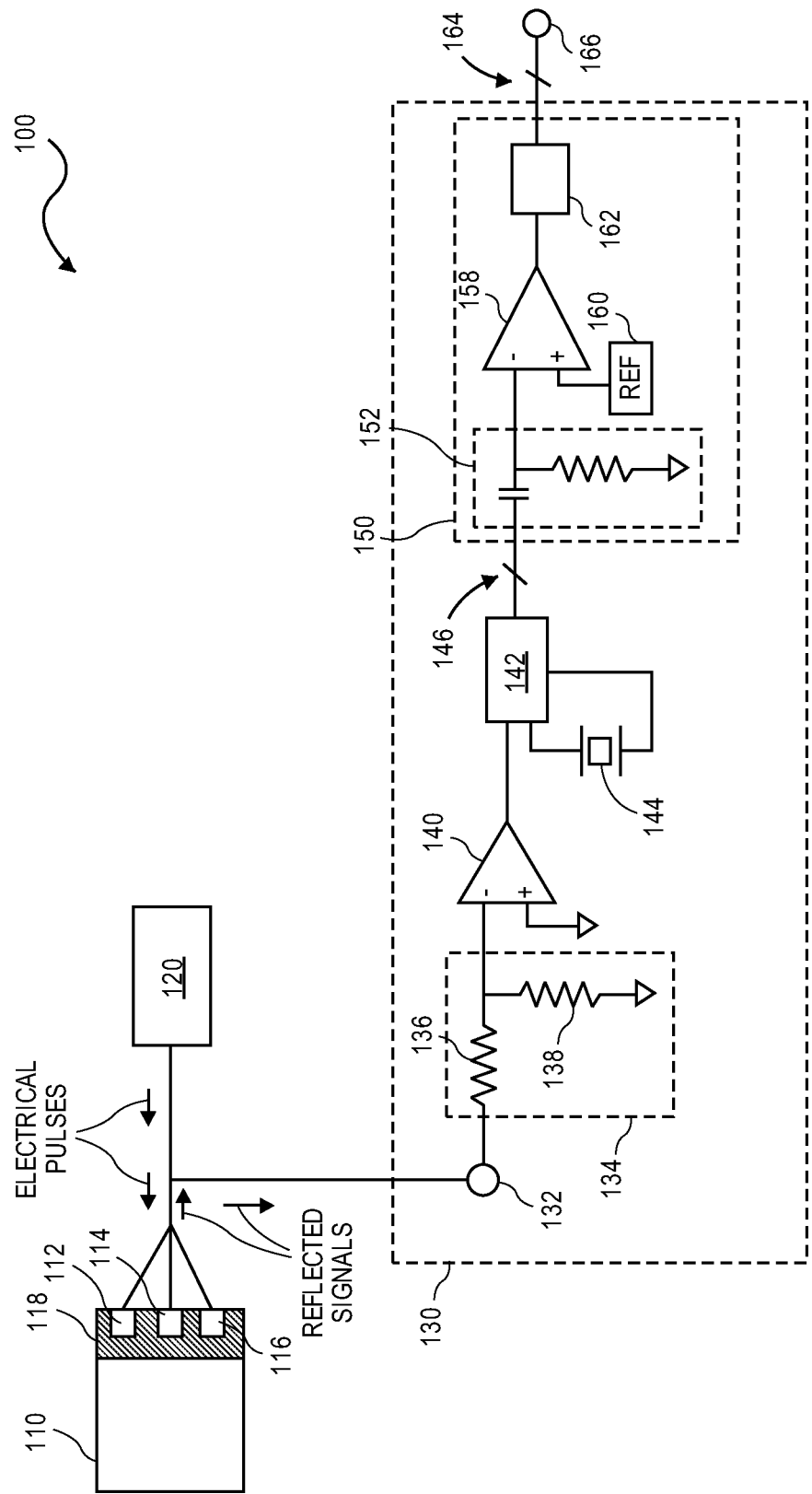
FIG. 1 illustrates a schematic view of a system for detecting a partial discharge, according to an embodiment.

It should be noted that some details of the figures have been simplified and are drawn to facilitate understanding of the embodiments rather than to maintain strict structural accuracy, detail, and scale.

DETAILED DESCRIPTION

Reference will now be made in detail to embodiments of the present disclosure, examples of which are illustrated in the accompanying figures. In the figures, like reference numerals have been used throughout to designate identical elements, where convenient. In the following description, reference is made to the accompanying figures that form a part of the description, and, in which is shown by way of illustration, one or more specific example embodiments in which the present teachings may be practiced.

Further, notwithstanding that the numerical ranges and parameters setting forth the broad scope of the disclosure are approximations; the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

FIG. 1 illustrates a schematic view of a system 100 for detecting a partial discharge, according to an embodiment. The system 100 is used to test a device 110. The device 110 includes three conductors 112, 114, 116, each corresponding to a different electrical phase. Each conductor 112, 114, 116 is at least partially surrounded by electrical insulation 118. The device 110 includes a motor or a portion of a motor. For example, the device 110 includes a motor that is assembled (e.g., with a rotor in place), a stator that has had the rotor removed (e.g., for preventative maintenance), a new motor that is being quality tested, a single-form wound coil designed for high-voltage stresses, DC interpoles, or a combination thereof.

The system 100 includes an impulse discharge board 120 that is connected to the device 110. The impulse discharge board 120 is configured to supply high-voltage electrical pulses to the device 110, one conductor 112, 114, 116 at a time. For example, the impulse discharge board 120 supplies a plurality of electrical pulses to the first conductor 112 to determine the voltage at which the electrical insulation 118 around the first conductor 112 experiences partial discharges. Then, the impulse discharge board 120 supplies a plurality of electrical pulses to the second conductor 114 to determine the voltage at which the electrical insulation 118 around the second conductor 114 experiences partial discharges, and so on.

The system 100 also includes a partial discharge detection board 130. The partial discharge detection board 130 is connected to the device 110, the impulse discharge board 120, or both. The partial discharge detection board 130 includes an input 132 configured to receive the signal that reflects off of the device 110. The partial discharge detection board 130 also includes a voltage divider 134 connected to the input 132. The voltage divider 134 is a resistive divider including two or more resistors (two are shown: 136, 138). In at least one embodiment, the voltage divider 134 does not include a capacitor or inductor; thus, the voltage divider has little or no capacitive reactance or inductive reactance.

The partial discharge detection board 130 also includes a buffer 140 connected to the voltage divider 134. The buffer 140 is or includes an operational amplifier ("op-amp"). In one example, the buffer 140 is a unity-gain buffer. The partial discharge detection board 130 also includes analog-to-digital converter ("ADC") 142 connected to the buffer 140. The analog-to-digital converter 142 includes an oscillator (e.g., a crystal oscillator) 144 that sets the clock rate of the analog-to-digital converter 142. As will be discussed in more detail below, the partial discharge detection board 130 does not include an anti-aliasing filter. More particularly, there is no anti-aliasing filter connected to and positioned between the buffer 140 and the analog-to-digital converter 142.

The partial discharge detection board 130 also includes a first bus 146 connected to the analog-to-digital converter 142. The first bus 146 is, for example, a 12-bit bus with digitized data. The partial discharge detection board 130 further includes a field programmable gate array ("FPGA") 150 connected to the bus 146. The field programmable gate array 150 includes a filter 152. The filter 152 is a high-pass, finite impulse response ("FIR") filter. In one example, the filter 152 is or includes a 100-pole finite impulse response filter. The field programmable gate array 150 also includes a comparator 158 connected to the filter 152. More particularly, the filter 152 is connected to an input (e.g., a negative input) of the comparator 158. A reference voltage source 160 is connected to another input of the comparator 158 (e.g., a positive input). The field programmable gate array 150 also includes a counter 162 connected to an output of the comparator 158.

The partial discharge detection board 130 also includes a second bus 164 connected to the field programmable gate array 150. More particularly, the second bus 164 is connected to the counter 162. The second bus 164 is, for example, an 8-bit bus. A microcontroller 166 is connected to the second bus 164.

Figure 2:
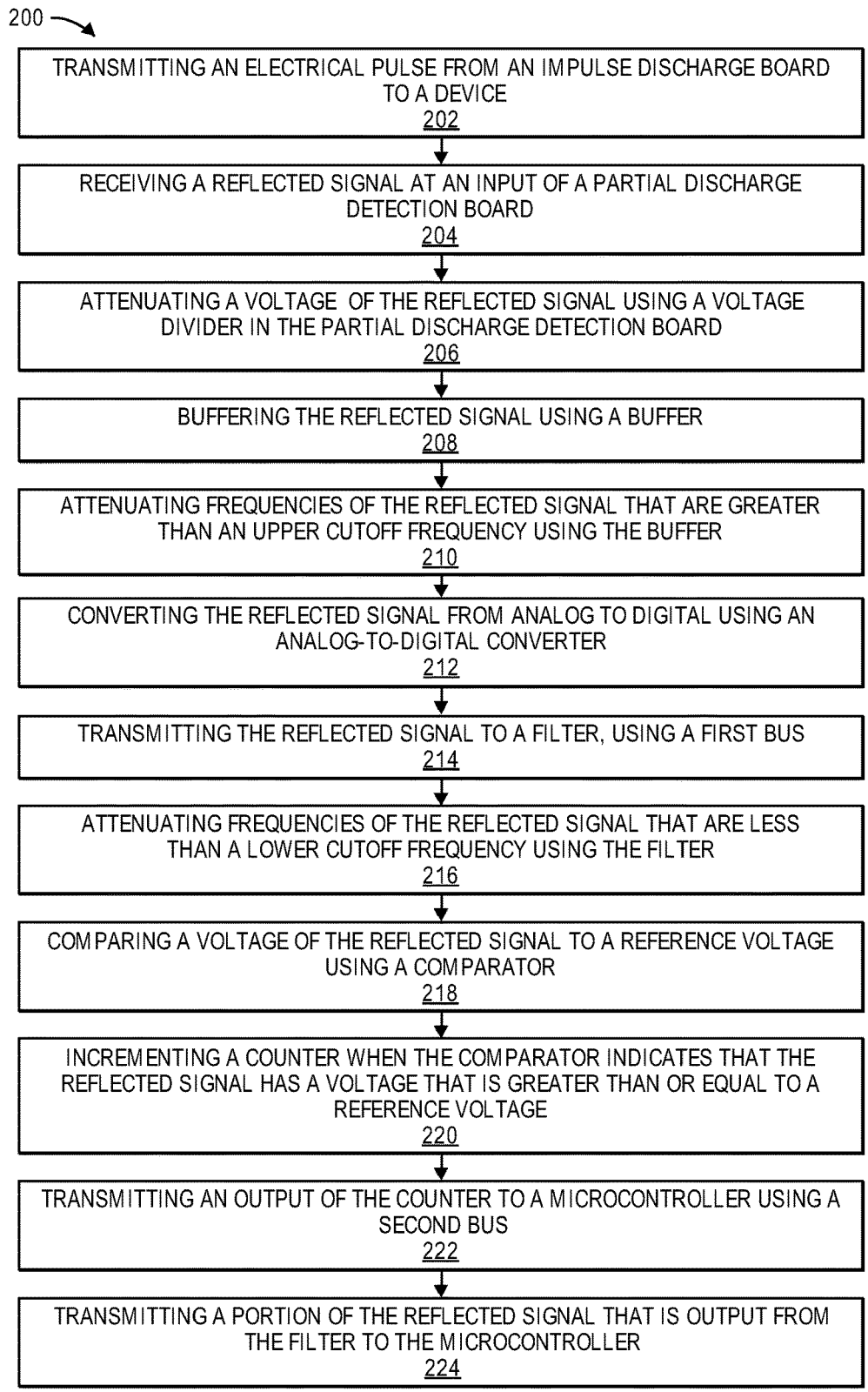
FIG. 2 illustrates a flow chart of a method for detecting a partial discharge, according to an embodiment.

FIG. 2 illustrates a flow chart of a method 200 for detecting a partial discharge, according to an embodiment. The method 200 includes transmitting one or more electrical pulses from the impulse discharge board 120 to the device 110, as at 202. More particularly, a plurality of electrical pulses are transmitted from the impulse discharge board 120 to the first conductor 112 of the device 110.

The electrical pulses are transmitted at a rate from about 1 pulse per second to about 20 pulses per second. For example, the electrical pulses are transmitted at about 5 pulses per second. The electrical pulses have a voltage from about 1V to about 15 kV. The electrical pulses each have a duration of less than about 100 nanoseconds. Each electrical pulse reflects off of the device 110 (e.g., the conductor 112 or the electrical insulation 118 proximate thereto), producing a reflected signal in the form of one or more wavelets. The reflected signal has a duration of less than about 500 microseconds.

The method 200 then includes receiving the reflected signal at the input 132 of the partial discharge detection board 130, as at 204. The method 200 then includes attenuating a voltage of the reflected signal using the voltage divider 134 in the partial discharge detection board 130, as at 206. As the voltage divider 134 is a resistive divider, it attenuates the reflected signal without limiting the frequency spectrum. This allows for a broader set of frequencies to pass to the buffer 140 and the analog-to-digital converter 142 than if the voltage divider 134 included capacitive or inductive components. For example, when the voltage divider 134 includes a capacitor, the voltage divider 134 acts as a high pass filter that removes lower frequencies.

The method 200 then includes buffering the reflected signal from a remainder of the partial discharge detection board 130 (e.g., the analog-to-digital converter 142 and the field programmable gate array 150) using the buffer 140, as at 208. This protects components of the partial discharge detection board 130 that are "downstream" from the buffer 140 from high-voltage surges that could damage the components.

The method 200 also includes attenuating frequencies of the reflected signal that are greater than an upper cutoff frequency using the buffer 140, as at 210. More particularly, the buffer 140 acts as a low-pass filter that attenuates frequencies of the reflected signal above the upper cutoff frequency. The upper cutoff frequency is from about 100 MHz to about 500 MHz or from about 200 MHz to about 300 MHz. In one example, the upper cutoff frequency is about 235 MHz. Thus, in this example, portions of the reflected signal above 235 MHz are removed from the reflected signal by the buffer 140.

The method 200 then includes converting the reflected signal from analog to digital using the analog-to-digital converter 142, as at 212. This includes sampling the reflected signal at a predetermined rate, which is determined by the oscillator 144. The predetermined rate is from about 30 MHz to about 500 MHz. In one example, the predetermined rate is about 100 MHz.

As mentioned above, the partial discharge detection board 130 does not include an anti-aliasing filter (e.g., connected to and positioned between the buffer 140 and the analog-to-digital converter 142). As a result, the analog-to-digital converter 142 receives portions of the reflected signal at frequencies above the Nyquist frequency and up to the upper cutoff frequency (e.g., 235 MHz). If the reflected signal contains data indicating that the device 110 experienced a partial discharge at the voltage of the electrical pulse that produced the reflected signal, this data is distributed between different frequencies in the reflected signal. In some embodiments, at least a portion of these frequencies are above the Nyquist frequency and would be removed by an anti-aliasing filter. Thus, by removing/omitting the anti-aliasing filter, the partial discharge detection board 130 is able to sense a larger proportion of the total discharge that is being measured by using the frequencies above the Nyquist frequency to amplify the sensed reflected signal, thereby allowing the strength/magnitude of the discharge to be more accurately measured.

The method 200 then includes transmitting the reflected signal, now in the digital domain, to the field programmable gate array 150, using the first bus 146, as at 214. More particularly, the reflected signal is transmitted to the (e.g., high-pass) filter 152 in the field programmable gate array 150. In addition to the reflected signal, the filter 152 also receives the electrical pulses transmitted from the impulse discharge board 120, which have a frequency from about 0 MHz to about 10 MHz. The electrical pulses do not include information related to potential partial discharges in the device 110. Thus, the method 200 also includes attenuating frequencies of the reflected signal that are less than a lower cutoff frequency using the filter 152, as at 216. The lower cutoff frequency is greater than or equal to the frequency of the electrical pulses to remove the electrical pulses. In one example, the lower cutoff frequency is from about 10 MHz to about 30 MHz (e.g., 20 MHz). As a result, the portion of the reflected signal between about 20 MHz and about 235 MHz passes through the filter 152.

The method 200 then includes comparing a voltage of the reflected signal to a reference voltage using the comparator 158, as at 218. The reference voltage is, for example, from about 5 mV to about 50 mV or about 10 mV to about 20 mV. When the reflected signal has a voltage greater than the reference voltage, this indicates that the device (e.g., the conductor 112 and/or the electrical insulation 118) experienced a partial discharge in response to the electrical pulse that produced the reflected signal. When the reflected signal has a voltage less than the reference voltage, this is attributed to noise, and no partial discharge is determined to have occurred.

The method 200 then includes incrementing the counter 162 when the comparator 158 indicates that the reflected signal has a voltage that is greater than or equal to the reference voltage, as at 220. An output of the counter 162 is transmitted to the microcontroller 166 using the second bus 164, as at 222. In addition, the portion of the reflected signal that is output from the filter 152 (e.g., having a frequency from about 20 MHz and about 235 MHz) is also transmitted to the microcontroller 166 using the second bus, as at 224. This is used to visually represent the waveform of the reflected signal.

While the present teachings have been illustrated with respect to one or more implementations, alterations and/or modifications may be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. The terms "couple," "coupled," "connect," "connection," "connected," "in connection with," and "connecting" refer to "in direct connection with" or "in connection with via one or more intermediate elements or members." Finally, "exemplary" indicates the description is used as an example, rather than implying that it is an ideal.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A partial discharge detection board, comprising:
   a voltage divider configured to attenuate a voltage of a reflected signal;
   a buffer connected to the voltage divider, wherein the buffer attenuates frequencies of the reflected signal that are greater than an upper cutoff frequency;
   an analog-to-digital converter connected to the buffer, wherein the partial discharge detection board does not include an anti-aliasing filter such that the analog-to-digital converter receives portions of the reflected signal above a Nyquist frequency of the analog-to-digital converter and up to the upper cutoff frequency, and wherein the analog-to-digital converter converts the reflected signal from an analog domain to a digital domain;
   a filter connected to the analog-to-digital converter, wherein the filter attenuates frequencies of the reflected signal that are less than a lower cutoff frequency;
   a comparator connected to the filter, wherein the comparator compares the voltage of the reflected signal to a reference voltage; and
   a counter connected to the comparator, wherein the counter increments when the voltage of the reflected signal is greater than the reference voltage.

2. The partial discharge detection board of claim 1, wherein the partial discharge detection board does not include the anti-aliasing filter between the voltage divider and the analog-to-digital converter.

3. The partial discharge detection board of claim 1, wherein the voltage divider is a resistive voltage divider.

4. The partial discharge detection board of claim 3, wherein the voltage divider does not include a capacitor or an inductor.

5. The partial discharge detection board of claim 1, wherein the buffer comprises a unity-gain operational amplifier.

6. The partial discharge detection board of claim 1, wherein the upper cutoff frequency is from about 100 MHz to about 500 MHz.

7. The partial discharge detection board of claim 1, wherein the upper cutoff frequency is greater than a sampling rate of the analog-to-digital converter.

8. The partial discharge detection board of claim 1, wherein the filter comprises a finite impulse response filter.

9. The partial discharge detection board of claim 1, wherein the lower cutoff frequency is from about 10 MHz to about 30 MHz.

10. The partial discharge detection board of claim 1, wherein the reference voltage is from about 5 mV to about 50 mV.

11. A partial discharge detection system, comprising:
    an impulse discharge board configured to be coupled to a device and to provide electrical impulses thereto;
    a partial discharge detection board configured to be coupled to the device and to receive a reflected signal therefrom, wherein the reflected signal is caused in part by a partial discharge in the device, the partial discharge detection board comprising:
- a voltage divider configured to attenuate a voltage of the reflected signal, wherein the voltage divider does not include a capacitor or an inductor;
- a buffer connected to the voltage divider, wherein the buffer attenuates frequencies of the reflected signal that are greater than an upper cutoff frequency;
- an analog-to-digital converter connected to the buffer, wherein the partial discharge detection board does not include an anti-aliasing filter such that the analog-to-digital converter receives portions of the reflected signal above a Nyquist frequency of the analog-to-digital converter and up to the upper cutoff frequency, and wherein the analog-to-digital converter converts the reflected signal from an analog domain to a digital domain;
- a filter connected to the analog-to-digital converter, wherein the filter attenuates frequencies of the reflected signal that are less than a lower cutoff frequency;
- a comparator connected to the filter, wherein the comparator compares the voltage of the reflected signal to a reference voltage; and
- a counter connected to the comparator, wherein the counter increments when the voltage of the reflected signal is greater than the reference voltage.

12. The partial discharge detection system of claim 11, wherein the upper cutoff frequency is from about 200 MHz to about 300 MHz, and wherein the lower cutoff frequency is from about 10 MHz to about 30 MHz.

13. The partial discharge detection system of claim 12, wherein the upper cutoff frequency is greater than a sampling rate of the analog-to-digital converter.

14. The partial discharge detection system of claim 11, wherein the partial discharge detection board further comprises a microcontroller connected to the counter, wherein the microcontroller receives:
- an output of the counter; and
- a portion of the reflected signal that is output from the filter.

15. The partial discharge detection system of claim 11, wherein, by not having an anti-aliasing filter in the partial discharge detection system, the partial discharge detection board is able to sense a larger proportion of the partial discharge than conventional systems by using frequencies above the Nyquist frequency to amplify the reflected signal, thereby allowing a strength of partial discharge to be more accurately measured.

16. A method for detecting a partial discharge, comprising:
- transmitting an electrical pulse to a device, wherein the electrical pulse reflects off of the device producing a reflected signal;
- attenuating a voltage of the reflected signal using a voltage divider;
- attenuating frequencies of the reflected signal that are greater than an upper cutoff frequency using a buffer; and
- converting the reflected signal from an analog domain to a digital domain using an analog-to-digital converter, wherein the analog-to-digital converter receives portions of the reflected signal between a Nyquist frequency of the analog-to-digital converter and the upper cutoff frequency,
- wherein none of the voltage divider, the buffer, and the analog-to-digital converter is connected to an anti-aliasing filter.

17. The method of claim 16, further comprising:
- attenuating frequencies of the reflected signal that are less than a lower cutoff frequency using a filter;
- comparing the voltage of the reflected signal to a reference voltage using a comparator; and
- incrementing a counter in response to the voltage of the reflected signal being greater than the reference voltage.

18. The method of claim 17, further comprising determining that the device experienced a partial discharge in response to the electrical pulse when the counter is incremented.

19. The method of claim 16, wherein converting the reflected signal from the analog domain to the digital domain comprises sampling the reflected signal at a sampling rate of the analog-to-digital converter, wherein the sampling rate is less than the upper cutoff frequency.

20. The method of claim 16, wherein the lower cutoff frequency is greater than a frequency of the electrical pulse.

* * * * *